United States Patent [19]

Criscuoli et al.

[11] Patent Number: 5,450,332

[45] Date of Patent: Sep. 12, 1995

[54] METHOD OF CREATING A MEBES PATTERN-GENERATION FILE FOR USE IN THE MANUFACTURE OF INTEGRATED-CIRCUIT MASKS

[75] Inventors: Stephen D. Criscuoli, Randallstown; Elvia C. Pérez, Severn; Gayle Fraser, Odenton; Frederick J. Osborne, Owings Mills, all of Md.

[73] Assignee: The United States of America as represented by the National Security Agency, Washington, D.C.

[21] Appl. No.: 264,887

[22] Filed: Jun. 24, 1994

[51] Int. Cl.$^6$ .............................................. G06F 17/50
[52] U.S. Cl. .................................. 364/490; 364/488
[58] Field of Search ............... 364/488, 489, 490, 491, 364/578, 468; 250/396 R, 398, 492.1, 492.2, 492.3

[56] References Cited

U.S. PATENT DOCUMENTS

| | | | |
|---|---|---|---|
| 4,610,940 | 9/1986 | Arainara | 430/5 |
| 4,831,546 | 5/1989 | Mitsuta et al. | 364/512 |
| 4,849,313 | 7/1989 | Chapman et al. | 430/5 |
| 4,869,998 | 9/1989 | Eccles et al. | 430/311 |
| 4,996,434 | 2/1991 | Tanaka | 250/492.3 |
| 5,031,111 | 7/1991 | Chao et al. | 364/491 |
| 5,046,012 | 9/1991 | Morishita et al. | 364/468 |
| 5,086,398 | 2/1992 | Moriizumi | 364/490 |
| 5,161,114 | 11/1992 | Akiyama | 364/490 |
| 5,164,907 | 11/1992 | Yabe | 364/491 |
| 5,210,696 | 5/1993 | Yano | 364/488 |
| 5,212,653 | 5/1993 | Tanaka | 364/491 |
| 5,231,590 | 7/1993 | Kumar et al. | 364/491 |
| 5,251,140 | 10/1993 | Chung et al. | 364/474.02 |
| 5,253,182 | 10/1993 | Suzuki | 364/489 |
| 5,303,161 | 4/1994 | Burns et al. | 364/490 |
| 5,309,354 | 5/1994 | Dick | 364/167.01 |
| 5,337,247 | 8/1994 | Hamaguchi | 364/468 |

*Primary Examiner*—Kevin J. Teska
*Assistant Examiner*—Susan Wieland
*Attorney, Agent, or Firm*—Robert D. Morelli; Thomas O. Maser

[57] ABSTRACT

A computer process of creating a Moving Electron Beam Exposure System (MEBES) pattern-generation file, that is to be used in the manufacture of integrated-circuit masks, from a technology-independent and semiconductor-process independent layout-design, by transmitting a scaleable and process-independent layout design to a computer, selecting the layers necessary for a particular semiconductor-process, selecting the scale to which the layout design will be converted, converting the layout design to that scale, positioning the layout design in a full-wafer or reticle-based layout, adding scribe lines, converting the layout design to a format acceptable to a conversion program, converting the layout design to a MEBES pattern-generation file, and transmitting the MEBES pattern-generation file in a format acceptable to a manufacturer of integrated-circuit masks.

19 Claims, 1 Drawing Sheet

METHOD OF CREATING A MEBES PATTERN-GENERATION FILE FOR USE IN THE MANUFACTURE OF INTEGRATED-CIRCUIT MASKS

FIELD OF THE INVENTION

The present invention relates to a method of creating Moving Electron Beam Exposure System (MEBES) pattern-generation files used in the manufacture of integrated-circuit masks.

BACKGROUND OF THE INVENTION

The steps involved in a typical design of an integrated circuit include 1) circuit design, 2) layout design, 3) design-rule checking, 4) creating pattern-generation files, 5) mask making, 6) fabrication, 7) packaging, and 8) testing. The present invention relates to the creation of pattern-generation files.

The process of making an integrated circuit starts with a circuit design of a desired function. The circuit design is typically simulated to guarantee proper operation. After the circuit design has been finalized, the physical layout of the circuit design is initiated. The physical layout is a series of polygons placed on various processing layers in such a way that fabrication of all of the polygons from all of the layers yields the intended circuit design.

There are two variables associated with a physical layout. One variable is the process. For example, the circuit design may have been designed for a double-metal, twin-well, Complementary Metal Oxide Semiconductor (CMOS) process. That is a process having an n-well layer, a p-well layer, an active area layer, a polysilicon layer, a p+ diffusion layer, an n+ diffusion layer, a first contact layer, a first metal layer, a second contact layer, a second metal layer, and a passivation layer.

Polygons created on the n-well layer define openings in silicon-dioxide through which n-type material can be diffused into the semiconductor substrate. P-channel transistors can subsequently be formed in the n-wells. Polygons created on the p-well layer define openings in silicon-dioxide through which p-type material can be diffused into the semiconductor substrate. N-channel transistors can subsequently be formed in the p-wells. Polygons created on the active area layer define openings in silicon-dioxide through which either n-type or p-type material can be diffused into the n-well or p-well. The source and drain of a p-channel transistor are simultaneously formed when p-type material is diffused through an active area polygon which is placed over and within an n-well polygon. The source and drain of an n-channel transistor are simultaneously formed when n-type material is diffused through an active area polygon over and within a p-well polygon. For a self-aligned silicon-gate process, a polygon on the polysilicon layer is created over a p-well (or an n-well) and under an active area so that, a polysilicon gate is formed between the source and drain of an n-channel (or p-channel) transistor.

Polygons on the polysilicon layer define where silicon will be deposited. onto the semiconductor wafer. Since the deposited silicon contains silicon crystals of various orientations, the deposited silicon is referred to as poly-crystalline silicon or polysilicon for short. The polysilicon deposited over an active area forms a gate between the drain and source of an n-channel (or p-channel) transistor. The polysilicon deposited outside of an active area acts as interconnect to other transistor gates or to other layers if a proper inter-layer structure is employed.

Polygons created on the first-contact layer define inter-layer structures between the polysilicon layer and the first-metal layer. Polygons on the first-contact layer are openings in silicon-dioxide through which metal can be deposited. Polygons on the first-metal layer define openings in the silicon-dioxide through which metal interconnect structures can be formed. A typical polysilicon-to-first-metal structure would consist of a polysilicon interconnect structure having one end under one end of a first-metal interconnect structure where the first-contact would be between these two ends. When metal is deposited for the first-metal interconnect structure, metal will also be deposited on the polysilicon interconnect structure via the first-contact layer so that the two interconnect layers are electrically connected.

Polygons created on the second-contact layer define inter-layer structures between the first-metal layer and the second-metal metal layer. Polygons on the second-contact layer are openings in silicon-dioxide through which metal can be deposited. Polygons on the second-metal layer define openings in the silicon-dioxide through which metal interconnect structure can be formed. A typical first-metal-to-second-metal structure would consist of a first-metal interconnect structure having one end under one end of a second-metal interconnect structure where the second-contact would be between these two ends. When metal is deposited for the second-metal interconnect structure, metal will also be deposited on the first-metal interconnect structure via the second-contact polygon so that the two interconnect layers are electrically connected.

Polygons created on the passivation layer are openings in the silicon-dioxide over the bond pads through which bondwires are connected.

The second variable in the layout of a circuit design is the technology (i.e., the minimum gate width of a transistor). Presently, technologies are at 1.25 microns, 1.0 microns, and 0.8 microns. A technology-independent layout design can be scaled to accommodate various technologies.

After the layout is completed, the layout is typically checked to ensure that it adheres to the rules associated with a particular vendor at which the semiconductor wafers will be fabricated. Before fabrication can start, the layout information (i.e., the polygons on the various layers) must be converted to a pattern-generation file. The pattern-generation file is used to create a mask for each of the layers in the semiconductor process (e.g., twin-well, double-metal CMOS). Each mask may contain all of the information needed to expose an entire semiconductor wafer (i.e., full wafer lithography) or each mask may contain a portion of the information needed to expose a portion of the semiconductor wafer (i.e., reticle-based lithography). In reticle-based lithography, a portion of a semiconductor wafer is exposed to the reticle. The wafer is then stepped so that another portion of the wafer can be exposed to the reticle. This procedure is repeated until the entire wafer has been exposed to the reticle.

The masks may contain one copy of a particular layout design, multiple copies of a particular layout design, or multiple copies of numerous layout designs. If multiple copies of a particular layout design or multiple copies of numerous layout designs are contained on one mask, each layout design is separated from the adjacent layout design by a scribe line (i.e., a line in which no circuitry is placed).

The present invention allows a user to input technology-independent and process-independent layout designs, define the technology and the process, create the desired mask placement of at least one layout design using full-wafer and reticle-based lithography, add scribe lines manually and automatically, and convert the resulting information into a MEBES pattern-generation file that can subsequently be used to manufacture integrated-circuit masks. The present invention is an improvement upon a method used by the University of Southern California (USC) in connection with its Metal Oxide Semiconductor Implementation Service (MOSIS). The inventors believe that the present invention does in one day what it takes the USC method three days to complete. The present invention allows for easy entry of technology and process selection where the USC method does not. The present invention is believed to have an improved graphical interface as compared to the USC method. The USC method requires the use of a Digital Equipment Corporation VMS operating system where the present invention does not. The present invention can automatically generate scribe lines where the USC method can not. The present invention provides status information that the USC method does not. The present invention allows layout designs to be input automatically where the USC method does not.

U.S. Pat. No. 5,161,114, entitled "METHOD OF MANUFACTURING A RETICLE," discloses a method of combining design data with alignment mark data.

U.S. Pat. No. 4,849,313, entitled "METHOD FOR MAKING A RETICLE MASK," discloses a method of placing alignment marking in the scribe lines so that die patterns can be placed in the reticle in relation to these alignment marks.

U.S. Pat. No. 4,610,940, entitled "METHOD FOR FABRICATING A PHOTOMASK PATTERN," discloses a method of using vernier patterns to measure printing shear. The present invention differs from the prior art in that the present invention pertains to a new method of converting layout design information into a pattern-generation file that can be used to create integrated-circuit masks, and more particularly to a method of converting layout design information into a MEBES pattern-generation file. MEBES files are used in conjunction with electron-beam lithography techniques. Electron-beam lithography is more precise than optical lithography.

U.S. Pat. No. 5,212,653, entitled "METHOD FOR PRODUCING A LAYOUT OF ELEMENT PORTIONS FOR A SEMICONDUCTOR INTEGRATED CIRCUIT USING A COMPUTER," discloses a method of using a computer to automatically generate a compact layout of a single bipolar integrated-circuit design. The present invention starts where U.S. Pat. No. 5,212,653 leaves off by disclosing a method of using a computer for arranging multiple copies of one or more integrated-circuit design, for which layout has already been completed, to form a computer tape containing the information necessary to create fabrication masks.

U.S. Pat. No. 5,164,907, entitled "COMPUTER AIDED DESIGN SYSTEM CAPABLE OF PLACING FUNCTIONAL BLOCKS WITH A CIRCUIT CONSTRAINT SATISFIED," discloses a method of using a computer to automatically generate a compact layout of a single integrated-circuit design. Again, the present invention does not deal with producing the layout of an integrated circuit but deals with the arrangement of integrated circuits, for which layout is complete, in order to produce a computer tape that can be used to make MEBES fabrication masks. The same can be said for U.S. Pat. No. 4,831,546, entitled "METHOD AND APPARATUS FOR ASSISTING LAYOUT DESIGN."

U.S. Pat. No. 4,869,998, entitled "INTEGRATED CIRCUIT SUBSTRATES," discloses a method of exposing integrated-circuit substrates to a composite representation in a regular and repeating manner. The present invention discloses a method of using a computer to create a computer tape of a single representation of one or more integrated-circuit designs that will be used to create fabrication masks that will be exposed once to a semiconductor wafer or a computer tape of a composite representation that will be used to create fabrication masks that will be exposed a number of times to a semiconductor wafer.

MICROFICHE APPENDIX

All computer programs necessary to make and use the present invention are included in a microfiche appendix which has been submitted with this specification to the United States Patent and Trademark Office. The microfiche appendix consists of nine microfiche sheets and a total of 811 frames.

SUMMARY OF THE INVENTION

The object of the present invention is to develop a fast, reliable, easy to use computer process to:
 a) transmit, manually and by electronic mail, technology-independent and semiconductor-process independent layout designs to a computer;
 b) position the layout designs as desired using reticle-based and full-wafer lithography;
 c) add scribe lines manually and automatically; and
 d) generate a MEBES pattern-generation file for the above-identified layout design.

This objective is achieved mainly by using a computer, preferably a SUN Microsystems SparcStation, having an input device, electronic mail capability, a graphical interface, and an output device along with various computer-program modules that perform the tasks necessary to create a MEBES pattern-generation file. The computer-program modules include a project submission module, a run closing module, a wafer layout module, a MEBES engine module, a file management module, a system statistic module, and a message handler module.

The project submission module allows a user to submit layout designs to the computer via electronic mail. The run closing module, which works in conjunction with the wafer layout module and the MEBES Engine module, allows a user to define the particular semiconductor-process that will be used to fabricate the layout design. The particular semiconductor-process determines the number of masks that will be created in the pattern-generation file. The run closing module also allows a user to define the scale of the design (e.g., 1.25 micron, 1.0 micron, etc.). The wafer layout module, which works in conjunction with the graphical interface of the computer, allows a user to control the selection and placement of layout designs. That is, a user can place multiple copies of a single layout design for reticle-based masks. In a reticle-based mask, the mask contains a subset of the number of layout designs that will actually appear on a semiconductor wafer. The wafer is repeatedly exposed to the reticle in order to fill the wafer with as many copies of the information contained on the reticle as possible. A user can also place every layout design that will appear on the semiconductor wafer. This approach is referred to as the full-wafer approach. In a full-wafer approach, the semiconductor wafer is exposed once to each mask layer. A user may place a single layout design or multiple layout designs on the masks.

The wafer layout module also allows a user to manually or automatically generate scribe lines. Scribe lines are areas where no circuitry is placed. Scribe lines are required between adjacent layout designs on a mask. Scribe lines typically consist of a polygon line on each of the layers that would create an opening in the silicon-dioxide. This results in a groove between the layout designs which is easier to cut and break.

A commercial software package, i.e., Computer Aided Transcription System (CATS), which is marketed by Transcription Enterprises Limited, is used to convert the result of the MEBES engine module to a MEBES pattern-generation file. The MEBES engine module is used to convert the result of the wafer layout module into a format acceptable to the CATS software. The MEBES pattern-generation file is then transmitted., via the output device of the computer, in a form acceptable to a manufacturer of MEBES-type masks. The masks (i.e., one for each semiconductor-process layer) can then be used in the manufacture of integrated-circuit versions of the layout design.

A file management module allows a user to document and archive the pattern-generation file. A system statistics module allows a user to check the status of the operation of the present invention. And finally, a message handler module displays status messages from the project submission module and the system statistics module, accepts electronic mail from a user, and monitors the operation of the present invention.

Figure 1:
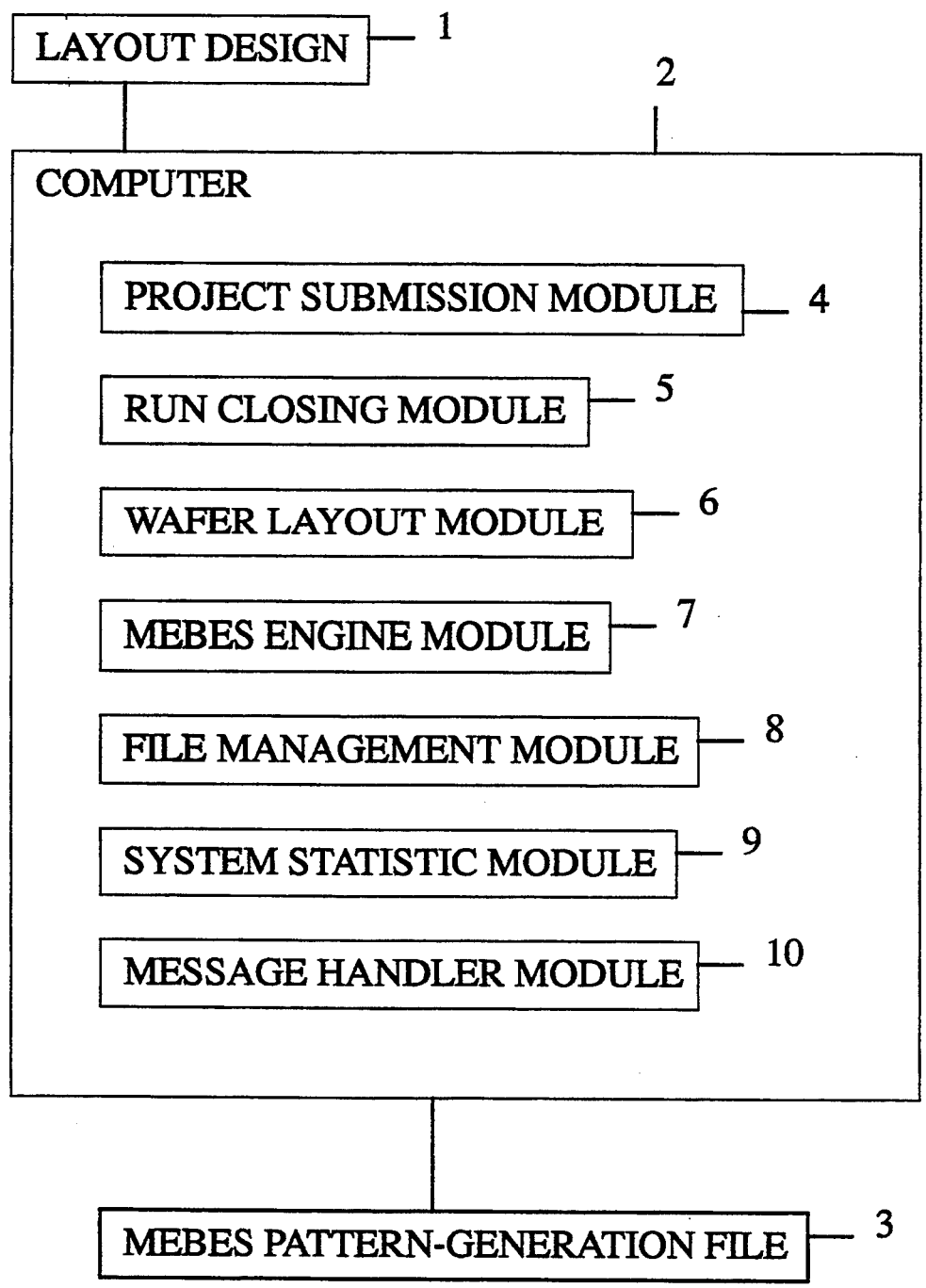
FIG. 1 is a block diagram of the computer process of the present invention.

The present invention, as illustrated fin FIG. 1, accepts layout designs 1 into a computer 2. The layout designs 1 are transmitted to the computer 2 via electronic mail or are manually typed into the computer 2. Any computer that has an input device, a graphical input device, electronic mail capability, an output device, and a UNIX operating system can be used as the computer 2. The preferred embodiment would use a Sun Microsystems SparcStation as the computer 2. Various programming modules contained within the computer 2 would allow the user to input at least one layout design 1, place the layout design 1 as desired, and convert the placement information along with the scribe lines into a MEBES pattern-generation file 3. The MEBES pattern-generation file 3 can be transmitted from the computer 2 in a form acceptable to a manufacturer of semiconductor-wafer masks.

The programming modules used in the present invention include a project submission module 4, a run closing module 5, a wafer layout module 6, a MEBES engine module 7, a file management module 8, a system statistic module 9, and a message handler module 10. Each of these modules are discussed below.

The project submission module 4 allows a user to submit a layout design 1 to the computer 2 via electronic mail. If the user wishes to manually submit a layout design 1, the user would manually type the layout design information into the computer 2 via the input device (i.e., a keyboard). The project submission module 4 generates the data necessary to create a new project. Its main functions are to check the syntax of the submission, generate a project identification number, and record the time that the submission was made.

The run closing module 5 allows a user to define the process (e.g., N-well CMOS) and the technology (e.g., 1.0 micron). The creation of a full-wafer or reticle-based layout is commonly referred to as a run closing. Wafer fabrication is commonly referred to as a run. The run closing module 5 works in conjunction with the wafer layout module 6 to create the full-wafer or reticle-based layout. The run closing module 5 works in conjunction with the MEBES engine module 7 to convert the output of the wafer layout module 6 to the format acceptable to software that converts the full-wafer or reticle-based layout into a MEBES pattern-generation file. In the preferred embodiment of the present invention, the conversion software is the Computer Aided Transcription System (CATS) software which is marketed by Transcription Enterprises Limited.

To start the run closing module 5 the user would transmit the letter combination "rcm" to the computer 2 via the input device. Three windows (i.e., message, status, and main-menu command window) will open on the display terminal of the computer 2. The message window displays errors and warning messages. The status window will be updated anytime there is a change to the run closing. For example, the process and technology used for a run closing will be displayed in the status window. There are seven options available in the main menu window (i.e., start, copy, wlm, mem, final, options, and exit).

If "start" is typed in the main-menu window a start window will be opened. The start window allows the user to specify the run identification number, the run name, the name of the user, the technology of the run, the technology (i.e., minimum gate width), the process (e.g., n-well CMOS).

A fabrication-list window allows the user to select a wafer foundry. The options in the fabrication-list window consist of describing the vendor, saving the wafer-foundry selection, opening a mask-list window, opening a package-list window, saving the names of the vendors selected, and canceling a previous selection. The mask-list window and the package-list window contain the names of the vendors who can provide the associated service. The project window displays the list of available projects that can be used for a particular run closing (i.e., projects that have compatible processes and technologies). Each item on the list contains the identification number of the layout design, the name of the design, the submission date of the design, the expected delivery date, the classification of the layout design, the process of the layout design (e.g., CMOS), the technology of the layout design (e.g., 1.0 micron), the well structure of the layout design, the number of integrated-circuits requested, the die size of the layout design, and the name of the run closing.

To select a project from the list, the user would use the computer 2 to select the desired project. A message will be displayed in the message window if the process or technology do not match those selected for the run closing. To save a selection the user would select the "ok" option. The user can also select all of the projects on the list, delete a project from the list, cancel a selection, exit the project window, or scroll up or down the list.

After the "start" option is completed a proj.info file, a run__name.info file, and a run__name.status file are created in a run closing directory.

A user can invoke the wafer layout module 6 from the run closing module 5 by typing the letters "wlm" in the main-menu window. If "wlm" is typed in the main-menu window a "wlm" window will be opened. The wafer layout module 6 is discussed below. The options available in the "wlm" window consist of editing the run-closing identification number, saving the run-closing identification number, and closing the "wlm" window. A user can also invoke the MEBES engine module 7 from the run-closing module 5 by typing the letters "mem" in the main-menu window. If these letters are so typed a "mem" window will be opened. The options available in the "mem" window are the same as the options available in the "wlm" window.

The option entitled "final" allows the user to remove any hierarchies that exist in the layout design data (i.e., allow the user to place all of the layout design data on the same level). The option entitled "option" opens an "options" window which allows a user to save the geometries of every window in the run closing module 5 and to close the "options" window. The option entitled "exit" allows the user to exit the run closing module 5. When exiting, the user must do three steps in order (i.e., source "run__name". csh, batcat "run__name"__jb. cinc, and batcat "run__name"fin__al.cinc).

The wafer layout module 6 allows a user to define the full-wafer or reticle layout. The wafer layout module is invoked by typing the letters "wlm" in the main-menu window. A work area window is created that graphically displays the full-wafer or reticle layout. The commands available to the user in the work area window are 1) align the project, 2) copy the project, 3) delete the project, 4) flip the project, 5) save the window position, 6) include a project from the list of projects, 7) move the project, 8) pan the work area window, 9) create/remove a ruler, 10) automatically add the scribe lines, and 11) zoom in/out.

A command window is also created when the wafer layout module 5 is invoked. The commands available in the command window are 1) quit the wafer layout module 5, 2) go to reticle mode, 3) specify the name of the technology file to be used, 4) specify the name of the file containing the list of projects, 5) specify the name of the job deck, 6) specify the name of the newly created job deck, 7) ask for the status of the run closing, 8) invoke a "placement" window which allows a user to control the placement and editing of a project and to manually place scribe lines, 9) automatically generate scribe lines, 10) display a grid, 11) remove any hierarchies in the layout design so that all of the data is on the same level, 12) combine layout designs, 13) view the entire project, 14) perform miscellaneous layout functions, and 15) print the full-wafer or reticle layout to a PostScript printer.

A status area and a message area are also created when the wafer layout module 5 is invoked. The status area displays the current status of the project name, the name of an existing job deck, the name of a newly created job deck, the name of the technology file being used, and the mouse coordinates. The message area displays all messages concerning the commands and operations performed.

The MEBES engine module 7 converts the result of the wafer layout module 6 into a format that is compatible with CATS software. The CATS software is used to convert the layout design to a MEBES pattern-generation file 3. The MEBES engine module 7 is invoked by typing "mem -run <run name>" in the main-menu window. The MEBES engine module 7 creates a file named <run name>.csh. The MEBES engine module 7 also creates files named <run name>.tek, <project ID>.__xx.cinc, and <run name>.status. These files respectively contain the technology file used with the layout design and a status report of the run closing.

The file management module 8 allows a user to document, archive, and utilize all of the technical information related to mask shops, wafer foundries, and assembly ,shops. This information is used by the run closing module 5 to complete the set of files necessary for the fabrication and assembly of the layout design. The file management module 8 also allows a user to backup all of the files associated with a run closing.

The file management module 8 is started by typing the letters "fmmx" into the computer 2. The options available in the file management module 8 include "vendors" and "runs." The "vendors" option allows a user to add, modify, or delete a vendor from a list of vendors. The "runs" option allows a user to obtain the status of a run closing and archive files associated with a run closing.

The system statistics module 9 allows the user to obtain status and project information related to a run closing. The system statistics module 9 generates system status reports, generates project progress reports, and provides a way to abort a run closing. The user can command the system statistics module 9 to abort a run closing, return project status information, return system status information, and place a time stamp on a run closing.

The message handler module 10 processes messages transmitted to the present invention. The message handler module 10 is invoked by typing the letters "overlord" into the computer 2. The message handler module 10 invokes internal queues and lists to track messages as they are received and communicates with the user through electronic mail.

What is claimed is:

1. A method of creating a Moving Electron Beam Exposure System (MEBES) pattern-generation file, wherein said file is used in the manufacture of integrated-circuit masks, comprising the steps of:
 a) transmitting at least one layout design that is technology-independent and process-independent to a computer having an input device, electronic mail capability, a graphical interface, a UNIX operating system, and an output device;
 b) selecting, within the computer, the semiconductor process for which an integrated-circuit mask will be manufactured for each layer of the at least one layout design;
 c) converting, within the computer, the at least one layout design to the semiconductor process selected in step (b);
 d) selecting, within the computer, the technology to which the at least one layout design will be converted;

e) converting, within the computer, the at least one layout design to the technology selected in step (d);

f) positioning, within the computer using the graphical interface of the computer, at least one copy of each of the at least one layout design transmitted to the computer in step (a) in the desired manner that the at least one copy of each of the at least one layout design will appear on the integrated-circuit masks;

g) adding scribe lines, within the computer, to the result of step (f);

h) converting the result of step (g) to a Moving Electron Beam Exposure System (MEBES) pattern-generation file;

i) producing, at the output of the computer, the MEBES pattern-generation file in a format acceptable to a manufacturer of integrated-circuit masks; and j) manufacturing integrated-circuit masks from the MEBES pattern-generation file.

2. The method of claim 1, wherein the step of positioning at least one copy of each of the at least one layout design is accomplished by positioning at least one copy of each of the at least one layout design in reticle-based format so that the resulting integrated-circuit masks can be used in a stepper-type lithographic process.

3. The method of claim 1, wherein the step of positioning at least one copy of each of the at least one layout design is accomplished by positioning at least one copy of each of the at least one layout design in full-wafer format so that the resulting integrated-circuit masks can be used in a full-wafer lithographic process.

4. The method of claim 1, wherein the step of adding scribe lines is accomplished by having a subroutine within the computer add the scribe lines without any human intervention.

5. The method of claim 1, wherein the step of adding scribe lines is accomplished by having a human add the scribe lines via the graphical interface of the computer.

6. The method of claim 1, wherein the step of transmitting at least one layout design to a computer is accomplished by transmitting at least one layout design from wherever said at least one layout design resides in electronic format to a computer via the electronic mail capability of the computer.

7. The method of claim 6, wherein the step of positioning at least one copy of each of the at least one layout design is accomplished by positioning at least one copy of each of the at least one layout design in reticle-based format so that the resulting integrated-circuit masks can be used in a stepper-type lithographic process.

8. The method of claim 7, wherein the step of adding scribe lines is accomplished by having a subroutine within the computer add the scribe lines without any human intervention.

9. The method of claim 7, wherein the step of adding scribe lines is accomplished by having a human add the scribe lines via the graphical interface of the computer.

10. The method of claim 6, wherein the step of positioning at least one copy of each of the at least one layout design is accomplished by positioning at least one copy of each of the at least one layout design in full-wafer format so that the resulting integrated-circuit masks can be used in a full-wafer lithographic process.

11. The method of claim 10, wherein the step of adding scribe lines is accomplished by having a subroutine within the computer add the scribe lines without any human intervention.

12. The method of claim 10, wherein the step of adding scribe lines is accomplished by having a human add the scribe lines via the graphical interface of the computer.

13. The method of claim 1, wherein the step of transmitting at least one layout design to a computer is accomplished by typing the at least one layout design into a computer via the input device of the computer.

14. The method of claim 13, wherein the step of positioning at least one copy of each of the at least one layout design is accomplished by positioning at least one copy of each of the at least one layout design in reticle-based format so that the resulting integrated-circuit masks can be used in a stepper-type lithographic process.

15. The method of claim 14, wherein the step of adding scribe lines is accomplished by having a subroutine within the computer add the scribe lines without any human intervention.

16. The method of claim 14, wherein the step of adding scribe lines is accomplished by having a human add the scribe lines via the graphical interface of the computer.

17. The method of claim 13, wherein the step of positioning at least one copy of each of the at least one layout design is accomplished by positioning at least one copy of each of the at least one layout design in full-wafer format so that the resulting integrated-circuit masks can be used in a full-wafer lithographic process.

18. The method of claim 17, wherein the step of adding scribe lines is accomplished by having a subroutine within the computer add the scribe lines without any human intervention.

19. The method of claim 17, wherein the step of adding scribe lines is accomplished by having a human add the scribe lines via the graphical interface of the computer.

* * * * *